(12) United States Patent
Lovell et al.

(10) Patent No.: US 10,436,843 B2
(45) Date of Patent: Oct. 8, 2019

(54) PROGRAMMABLE CURRENT SINK FOR CONTACT INPUT CIRCUITS

(71) Applicant: GENERAL ELECTRIC COMPANY, Schenectady, NY (US)

(72) Inventors: Alan Carroll Lovell, Salem, VA (US); Bruce Henderson, Salem, VA (US)

(73) Assignee: General Electric Company, Schenectady, NY (US)

( * ) Notice: Subject to any disclaimer, the term of this patent is extended or adjusted under 35 U.S.C. 154(b) by 151 days.

(21) Appl. No.: 15/528,255

(22) PCT Filed: Nov. 21, 2014

(86) PCT No.: PCT/US2014/066820
§ 371 (c)(1),
(2) Date: May 19, 2017

(87) PCT Pub. No.: WO2016/081009
PCT Pub. Date: May 26, 2016

(65) Prior Publication Data
US 2017/0343609 A1    Nov. 30, 2017

(51) Int. Cl.
*G01R 31/327* (2006.01)
*G05F 1/56* (2006.01)

(52) U.S. Cl.
CPC .......... *G01R 31/3278* (2013.01); *G05F 1/56* (2013.01); *G01R 31/327* (2013.01); *G01R 31/3277* (2013.01)

(58) Field of Classification Search
CPC .. G01R 31/00; G01R 31/327; G01R 31/3277; G01R 31/3278; G01R 31/333; G05F 1/56; H02B 11/26; H02B 1/18

USPC ........ 324/415, 418, 419, 424; 361/160, 166, 361/183, 191, 206, 626, 819
See application file for complete search history.

(56) References Cited

U.S. PATENT DOCUMENTS

| | | |
|---|---|---|
| 4,621,201 A | 11/1986 | Amdahl et al. |
| 5,339,019 A | 8/1994 | Benz |
| 6,069,522 A | 5/2000 | Venkatraman et al. |
| 6,226,696 B1 * | 5/2001 | Lin .......................... G06F 1/266 345/161 |
| 6,859,157 B1 | 2/2005 | Gunther |

(Continued)

FOREIGN PATENT DOCUMENTS

WO    2016/089384 A1    6/2016

OTHER PUBLICATIONS

Glosser, Jr., et al., Universal contact input supporting programmable wetting current, GE Application No. PCT/US2014/047223, filed on Jul. 18, 2014.

(Continued)

*Primary Examiner* — Hoai-An D. Nguyen
(74) *Attorney, Agent, or Firm* — Armstrong Teasdale LLP

(57) ABSTRACT

A system and method according to various embodiments can include a programmable current sink circuit that comprises a digital-to-analog converter (DAC). The DAC is programmable to set an adjustable magnitude of current sink so that a proper amount of current is jointly sunk from a plurality of inputs to generate a total sink current. With the adjustable current sink, redundant inputs, such as dual modular redundancy or triple modular redundancy, or simplex inputs can jointly sink the proper amount of current.

20 Claims, 2 Drawing Sheets

(56) References Cited

U.S. PATENT DOCUMENTS 8,035,528 B2    10/2011  Acharya et al.
8,283,876 B2 *  10/2012  Ji ....................... H05B 33/0854
                                                    315/227 R
2005/0122225 A1 *  6/2005  Kram ..................... G01M 3/38
                                                    340/605
2014/0281048 A1    9/2014  Alley et al.

OTHER PUBLICATIONS

International Search Report and Written Opinion issued in connection with corresponding PCT Application No. PCT/US2014/066820 dated Mar. 10, 2015.
International Preliminary Report on Patentability issued in connection with corresponding PCT Application No. PCT/US2014/066820 dated May 23, 2017.

\* cited by examiner

PROGRAMMABLE CURRENT SINK FOR CONTACT INPUT CIRCUITS

FIELD OF THE INVENTION

The present invention relates generally to an integrated circuit (IC). More particularly, the present invention relates to a circuit that provides a programmable current sink, which is programmed to selectively operate either in a current sink mode or a band pass filter mode.

BACKGROUND OF THE INVENTION

Data acquisition and control systems, as well as microprocessor and microcontroller based boards and units, typically include "digital" inputs and outputs. There are many types of digital inputs and outputs, and their interface capabilities can differ depending upon the manufacturer's specification. A digital input typically consists of a power supply (voltage source), a switch and a voltage-sensing device (analog-to-digital converter).

Depending on the switch's open/closed status, the sensing device detects a voltage or no voltage condition, which in turn generates a logical 0 or 1, on or off, alarm or normal or similarly defined state. A digital output typically consists of a switch (either mechanical as in a relay, or electronic as in a transistor or triac) that either opens or closes the circuit between two terminals depending on the binary state of the output.

The most common type of digital input is a contact closure. Essentially a sensor or switch of some type closes or opens a set of contacts in accordance with some process change. An applied electrical signal then determines whether the circuit is open or closed. Current flows if the circuit is closed, registering, for example, a "1" in a transistor at the computer interface. Conversely, an open circuit retains a high voltage (and no current), registering a "0" at the transistor.

Accordingly, there are several types of digital inputs and outputs, which are commonly included in many control systems and board products and units when used for specific applications. For example, low voltage, direct current (DC) wetted contacts are common digital inputs to control systems used in relay applications.

A relay is usually an electromechanical device that is actuated by an electrical current. The current flowing in one circuit causes the opening or closing of another circuit. Relays are like remote control switches and are used in many applications because of their relative simplicity, long life, and proven high reliability.

Over the years, a full range of relay products from highly specialized relays from communication equipment to general-purpose relays have been designed to control nearly every function in commercial and industrial processes used in everything from household appliances to industrial machinery. In the home, relays are used in refrigerators, washing machines and dishwashers, and heating and air-conditioning controls.

A power generation plant is one example of an industrial process in which a large number of electrical contacts (e.g., relays and switches) are used. The electrical contacts, such as the relays, in a power generation plant can be used to control a wide variety of equipment such as motors, pumps, solenoids and lights. Highly sophisticated relays can be utilized to protect electric power systems against trouble and power blackouts as well as to regulate and control the generation and distribution of power.

In the example scenario described above, a control system needs to monitor the relays within the power plant to determine their status in order to ensure that certain functions associated with the process are being performed. Often, wetted contacts are utilized to monitor the status of the relays. A relay circuit works by using a sensing unit, the electric coil, which is powered by alternating current or direct current.

When the applied current exceeds a threshold value, the coil then activates the armature, which either closes the open contacts or opens the closed contacts. When power is supplied to the coil, it produces a magnetic force that activates the switch mechanism. The magnetic force passes along the action from a circuit to another. The first circuit is called the control circuit; the second is called the load circuit.

The contacts are the most important constituent of a relay. Their characteristics are significantly affected by factors such as the material of the contacts, voltage and current values applied to them (especially, the voltage and current waveforms when energizing and de-energizing the contacts), the type of load, operating frequency, and bounce. If any of these factors fail to satisfy a predetermined value, problems such as metal degradation between contacts, contact welding, wear, or a rapid increase in the contact resistance may occur.

Contact input status detection circuits are used to detect the status of relay contacts when in use in the field. The contact input status detection circuit monitors provide an indication of potentially degraded electrical relay performance due to contamination.

In industrial environments, contamination routinely interferes with the operation of the relay's contact. Contaminants, which can include oxidation films or foreign particles, tend to produce contact resistance readings that are either high or unstable. Contamination commonly happens with low current applications, usage in high temperature and humidity environments, and during extended periods of storage.

For example, in small currents and low voltage applications, oxidation of relay contact is simply a buildup of corrosion on relay contact surfaces over a period of time. The contacts develop oxidation, which is a thin layer of oxide on the contact surface. It causes problems by increasing the resistance across the contacts which, depending on the amplitude of the voltage being switched, can cause loss of signal or overheating of the contacts.

Oxidation on relay contacts is especially a problem with small currents and low voltages, because they cannot punch through the oxide layer once it accumulates and becomes too thick. One conventional approach to resolve this issue for small currents and low current applications is by passing the required wetting current through the relay contacts so that it punches through the oxide layer. The wetting current is the minimum current needed to flow through a contact to break through any film (contact oxidation) that may have been deposited on the switch.

When the contact is in an open position, the circuit is broken and no current may flow. When closed, the low voltage power supply will provide current which flows through the contact and the sensing circuit. Thus, the circuit must have low enough resistance to allow a substantial current to flow, approximately a few milliamperes (mA), to improve reliability by minimizing oxidation of the contacts and to improve contact wiping.

Thus, another common digital input to control systems, which is often used in relay applications, is "current sink."

The current sink can be considered a load with a special behavior, in which it will increase its own impedance when the voltage across it increases, and decrease it as much as the voltage drops, thus keeping the current through it also constant. A current sink circuit can be used to supply a few mA to a load such as a relay.

It is important to note that most logic gates can "sink" a very limited amount of current, usually in the order of a few mA. Thus, universal input/output (IO) application-specific integrated circuits (ASICs) have a restriction by design. The I/O pins have limited current sink capability so that its current sink is fixed at approximately 7.5 mA. However, when a system needs to support multiple ASIC chips on a board, such as two or three ASICs redundantly, the fixed current sinks add. This generates excessive current and requires active circuitry to be included on dual terminal board or triple modular redundancy (TMR) board configurations.

SUMMARY OF THE INVENTION

Given the aforementioned deficiencies, a need exists for a system that supports multiple ASICs, which can sink the proper amount of current, avoid excessive current, and does not require active circuitry on TMR or dual terminal boards. A need also exists for a system that can measure the sink current for diagnostic analysis.

Under certain circumstances, an embodiment of the present invention includes a programmable circuit for sensing signals, which comprises a programmable current sink circuit. The programmable current sink circuit includes a plurality of inputs coupled to sense input signals received from at least one input/out device, such as a relay contact. The programmable current sink circuit comprises a digital-to-analog converter (DAC) that is programmable to set an adjustable magnitude of current sink so that a proper amount of current is jointly sunk from the plurality of inputs to generate a total sink current. A processor is provided for programming the programmable sink current circuit.

A method of sensing signals according to various exemplary embodiments can include providing a programmable current sink circuit having a plurality of inputs coupled to sense input signals received from at least one input/out device, wherein the programmable current sink circuit comprises a digital-to-analog converter (DAC); and programming the DAC to set an adjustable magnitude of current sink so that a proper amount of current is jointly sunk from the plurality of inputs to generate a total sink current.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

Figure 1:
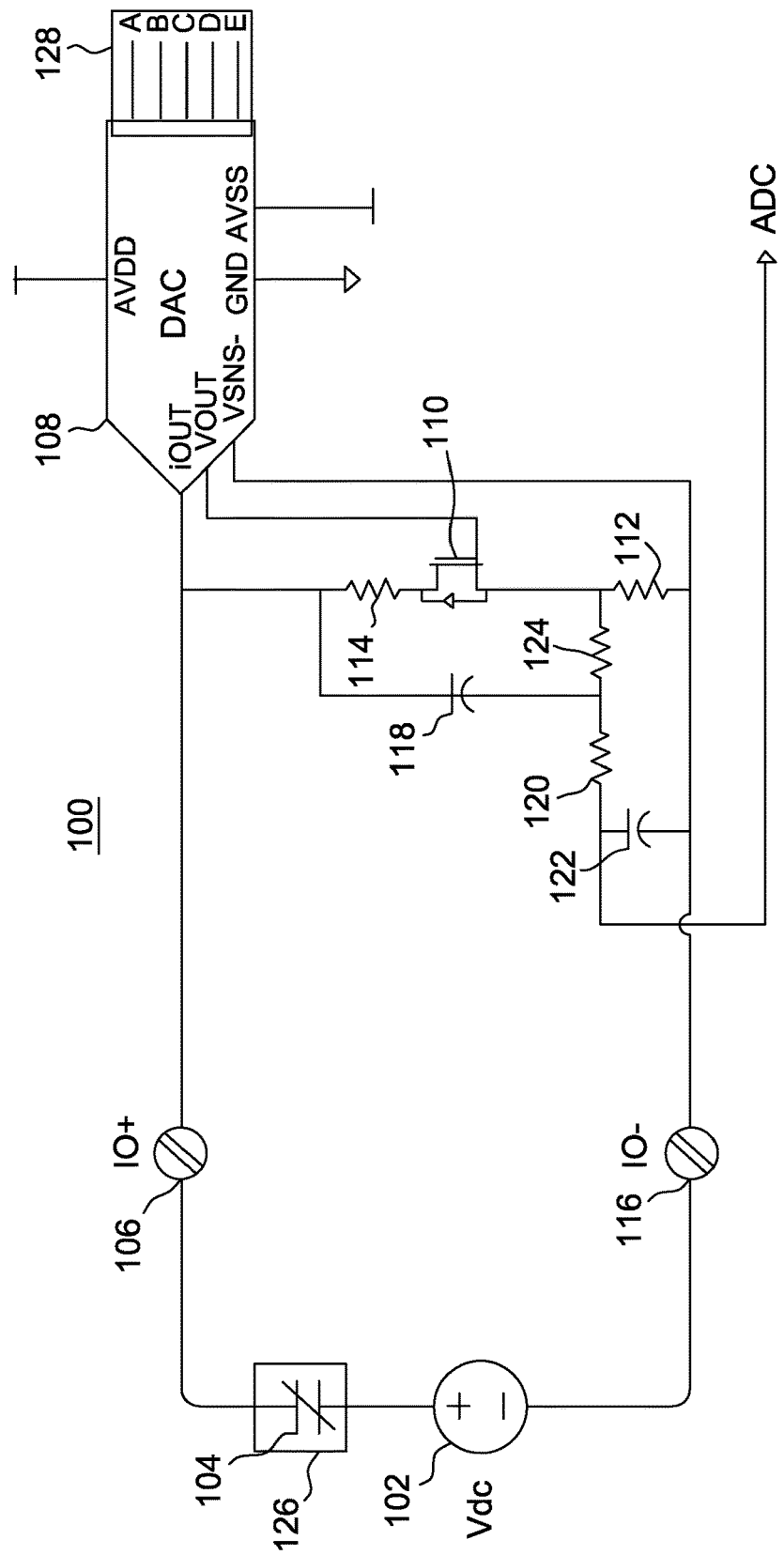
FIG. 1 shows a schematic diagram of an exemplary circuit in accordance with the present teachings.

The present invention may take form in various components and arrangements of components, and in various process operations and arrangements of process operations. The present invention is illustrated in the accompanying drawings, throughout which, like reference numerals may indicate corresponding or similar parts in the various figures. The drawings are only for purposes of illustrating preferred embodiments and are not to be construed as limiting the invention. Given the following enabling description of the drawings, the novel aspects of the present invention should become evident to a person of ordinary skill in the art.

DETAILED DESCRIPTION OF VARIOUS EMBODIMENTS

The following detailed description is merely exemplary in nature and is not intended to limit the applications and uses disclosed herein. Further, there is no intention to be bound by any theory presented in the preceding background or summary or the following detailed description.

Throughout the application, description of various embodiments may use "comprising" language, however, it will be understood by one of skill in the art, that in some specific instances, an embodiment can alternatively be described using the language "consisting essentially of" or "consisting of."

For purposes of better understanding the present teachings and in no way limit the scope of the teachings, it will be clear to one of skill in the art that the use of the singular includes the plural unless specifically stated otherwise. Therefore, the terms "a," "an" and "at least one" are used interchangeably in this application.

Unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that may vary depending upon the desired properties sought to be obtained. In some instances, "about" can be understood to mean a given value±5%. Therefore, for example, about 100 nm, could mean 95-105 nm. At the very least, each numerical parameter should at least be construed in light of the number of reported significant digits and by applying ordinary rounding techniques.

Various embodiments provide a circuit that employs a highly integrated DAC to set an adjustable magnitude of current sink. With adjustable current sink, redundant inputs (dual, TMR, etc.) or simplex inputs can jointly sink the proper amount of current. Any number of redundant inputs can be programmed to share the current. If one input circuit fails, the remaining input circuits may increase their contribution to maintain the total sink current.

Various embodiments relate to an element of a programmable and universal IO interface wherein the programmable circuit contains a highly integrated DAC with current and voltage output ability. The voltage output is used to set the sink current.

Other illustrious embodiments relate to a circuit that has a low enough resistance to allow a substantial current to flow, a few mAs, to improve reliability by minimizing oxidation of the relay contacts and to improve contact wiping.

Additional embodiments relate to a programmable current sink circuit that is configured by a programming circuit. In these embodiments, a system and method comprises a circuit that is capable of measuring the actual sink current to perform diagnostics and to feedback a value for adjustment.

Also included is a dual mode circuit. Namely, the system and method comprises a circuit that can selectively operate in a band pass filter mode when not in current sink mode. The system and method are capable of performing all of the above described features with a single metal oxide field effect transistor (MOSFET), without the addition of multiplexors or switches.

FIG. 1 is a circuit diagram of a programmable current sink circuit 100 used to detect the status of an electric contact (hereinafter "contact") as used, for example, in an industrial or commercial process according to one embodiment of the present invention. As used herein, a contact is an electrical component for joining electric circuits together or breaking the circuits by interrupting or diverting the current from one conductor to another. Examples of contacts include electrical components such as switches, relays, terminals and connectors.

One particular example of an industrial process in which embodiments of the present invention is suitable for use is with a power generation plant where a large number of contacts are used to control a wide variety of equipment such as motors, pumps, solenoids and lights. Those skilled in the art will recognize that embodiments of the present invention are applicable to other industrial processes where contacts are used to control the operation of process equipment and where it is desirable to ascertain the status of such contacts for the purpose of sequence of events (SOE) analysis.

In various embodiments, circuit 100 can be incorporated as an element of a programmable and universal I/O interface. As such, the programmable circuit contains a highly integrated DAC with current and voltage output ability. The voltage output is used to set the sink current.

Through the use of wetted contacts, circuit 100 is capable of detecting relay contact status conditions that include whether the contact is closed, the contact is open, or the contacts are contaminated due to corrosion (oxidation). The circuit 100 can measure the actual sink current for diagnostics and to feedback a value for adjustment. More specifically, the circuit 100 monitors the status of wetting voltage and wetting current.

The wetting voltage (also known as sense voltage) is the voltage provided to electrical contacts for status detection. The wetting voltage is used to detect the operation of either a contact opening or closing. To monitor the status of the electrical contacts, an electrical voltage (e.g. a DC voltage or an alternating current (AC) voltage) is sent to the contacts in the field to determine whether this voltage can be detected. Detecting the voltage is an indication that the electrical current is on or off.

As discussed above, if the contact is operated in a low voltage application, the contacts will tend to accumulate excessive resistance and may fail prematurely. In order to keep the switch in good health, the wetting current is the minimum current needed to flow through a contact to break through any film (contact oxidation) that may have been deposited on the switch.

The current and voltage output capability of the DAC enables the circuit 100 to monitor the wetting current and wetting voltage by wetting the contacts.

Programmable current sink circuit 100 can be configured by a programming circuit. The current sink circuitry 100 is adapted to be programmably controlled to set an adjustable magnitude of the current sink. The highly integrated DAC can be programmed to set the voltage output. It is to be understood that any type of processor or microcontroller circuit can be used to program the circuit. A system within which the programmable circuit can be advantageously implemented is a universally programmable I/O interface (Universal 10). The circuit 100 simplifies the mode selection in a universally programmable I/O interface, because multiplexor input and switches are avoided.

The programmable current sink circuit 100 includes a plurality of digital inputs 128 (A, B, C, D, E) for receiving signals from electrical contacts that controls at least one I/O device 126. Devices that provide electrical signal outputs and/or are controlled by electrical signal inputs are referred to generally as I/O devices. Exemplary I/O devices can include, for example, switches, relays, relay contacts, light bulbs, solenoid valves, potentiometers, proximity sensors, and temperature controllers. Typical I/O devices used in industrial applications include pumps, valves, mass flow controllers, and thermocouples. Thus, in various embodiments, circuit 100 can be utilized to sense signals from electrical contacts that control various types of devices.

In reference to FIG. 1, programmable current sink circuit 100 incorporates a switch, such as a relay, having a pair of contacts 104. The circuit 100 uses a highly integrated DAC 108 to set an adjustable magnitude of the current sink. The adjustable current sink feature enables redundant inputs (dual, TMR, etc.) or simplex inputs to jointly sink the proper amount of current. Thus, any number of redundant inputs can be programmed to share the current. Should one input circuit fail, the remaining input circuits may increase their contribution to maintain the total sink current.

The programmable current sink circuit 100 is controlled by the voltage output set by DAC 108. The voltage output is used to set the sink current. The highly integrated DAC 108 may be programmed to set a voltage output provided to a MOSFET 110, which is configured as a voltage follower. The MOSFET 110 output voltage and resistor 112 set the programmed amount of current such that they function collectively as a current source. A field voltage supply 102 and a contact 104, when closed, supply current to the input loop formed by terminal 106, load resistor 114, current source 110 and 112, terminal 116, and the current is then fed back to voltage supply 102.

In the embodiments, the programmable current sink circuit 100 is configured to selectively operate in dual modes of the current sink. Thus, the circuit 100 receives an input that selects the mode of operation depending on the command instructions received into the system.

In a first mode of operation, DAC voltage output is positive and the MOSFET 110 acts as a current sink. In the second mode of operation, the DAC voltage output is negative to completely switch off the MOSFET 110. In the second mode, capacitor 118 bypasses the MOSFET 110 to setup a band pass filter, as described below.

Several components, which include capacitors 118, 122 and resistors 120, 124, perform a dual purpose based on the mode of operation. In the first mode, which is a current sink mode, the DC component of the current flowing through resistor 112 is measured by the analog-to-digital converter (ADC) 126 through resistors 120, 124. The circuit senses the current being sunk. The voltage sensed indicates the amount of current flow supplied into the current sink. The sensed voltage signal is fed through the ADC, which converts the sensed signal to digital current data. The digital signal data can be used to verify that the proper amount of current is being jointly sunk in dual, TMR or simplex applications.

In the second mode, which is a band pass filter mode, a band pass filter, which comprises capacitors 118, 122 and resistors 120, 124, is formed and an AC voltage waveform is presented to and converted by the ADC 126. In the band pass filter mode, the filter attenuates frequencies on either side of a specified transmission band.

Thus, the dual modes of operation of circuit 100 enable both a programmable DC current sink for contact input mode and a band pass filtered voltage measurement to support highway addressable remote transducer (HART®) in mA current output mode.

Thus, in various embodiments, circuit 100 relates to a component within a control system implemented via the HART protocol. HART is a known process industry standard communication protocol for sending and receiving digital information across analog wires between smart devices and control or monitoring system.

A HART device is generally a sensor or an actuator that may be used, for example, to control or monitor a system, such as a steam turbine or a gas turbine. The HART device facilitates communication within the control system using the well-known HART protocol. A HART sensor device controls current flowing in a wire, while a HART actuator device is controlled by the current flowing in the wire. HART devices are interfaced to the control system along a HART channel using modules that perform current loop measurements and current loop driving.

Figure 2:
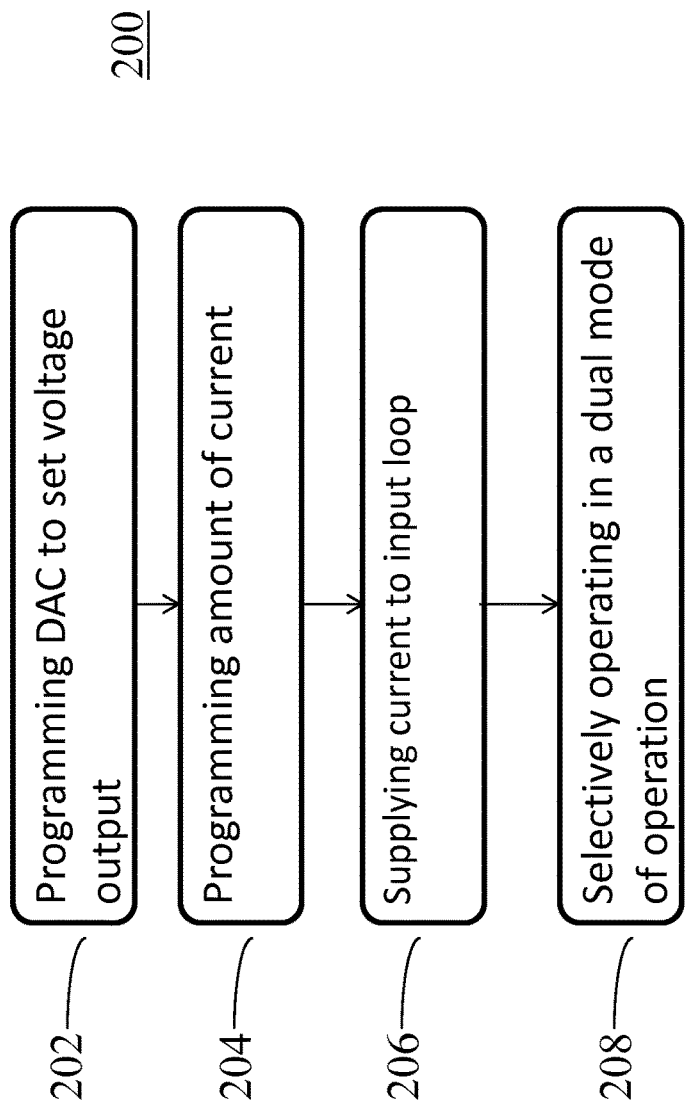
FIG. 2 is a flowchart of an exemplary method of practicing the present invention in accordance with the present teachings.

FIG. 2 is a flowchart of an exemplary method 200 of operating a programmable current sink in accordance with the embodiments. In Step 202, a DAC is programmed to set a voltage output which is fed to a MOSFET configured as a voltage follower. In Step 204, the programmed amount of current is set using the MOSFET output voltage and a resistor.

In Step 206, when closed, the field voltage supply and contacts supplies current to the input loop, which is formed by a pair of terminals, a load resistor, and a current source, that comprises the MOSFET and a resistor. In Step 208, the circuit can be selectively operated in one of two modes of operation. The dual modes of operation include a current sink mode and a band pass filter mode.

Programmable current sink circuits designed in accordance with embodiments of the present invention have numerous technical and commercial advantages. For example, the system and method relates to universally programmable I/O interfaces that enable either simplex or redundant operations. Various embodiments provide an interface architecture for an ASIC. The interface architecture enables redundant I/O, which can support TMR, dual or simplex operations.

Another advantage is improved performance achieved with a simplified circuit design, which comprises a single MOSFET which performs a dual function without the inclusion of switches. A further advantage is that, by providing an adjustable current sink, the circuit solves a design issue of a fixed current sink, which is common to conventional universal I/O ASIC.

Those skilled in the art will also appreciate that various adaptations and modifications of the preferred and alternative embodiments described above can be configured without departing from the scope and spirit of the invention. Therefore, it is to be understood that, within the scope of the appended claims, the invention may be practiced other than as specifically described herein.

We claim:

1. A programmable circuit for sensing signals comprising:
a programmable current sink circuit having a plurality of inputs coupled to sense input signals received from at least one input/output device;
the programmable current sink circuit comprises a digital-to-analog converter (DAC) that is programmable to set an adjustable magnitude of current sink so that a proper amount of current is jointly sunk from the plurality of inputs to generate a total sink current; and
a processor for programming the programmable sink current circuit, wherein the programmable current sink circuit is configured for dual modes of operation including a first mode of operating as a current sink mode and a second mode of operating as a band pass filter mode.

2. The circuit according to claim 1, wherein the programmable current sink circuit senses the current being sunk.

3. The circuit according to claim 1, wherein the programmable current sink circuit is controlled by a voltage output set by the DAC.

4. The circuit according to claim 1, wherein the input signals are redundant signals supplied from a plurality of redundant input circuits, and wherein the magnitude of current sink is adjustable to program the redundant inputs of the plurality of redundant input circuits to share the current.

5. The circuit according to claim 4, wherein the programmable current sink circuit is configured to implement a redundancy scheme, and the redundancy scheme is based on dual modular redundancy or triple module redundancy (TMR).

6. The circuit according to claim 4, wherein the programmable current sink circuit is utilized to increase a current contribution of remaining redundant input circuits to maintain the total sink current when at least one redundant input circuit fails.

7. The circuit according to claim 1, wherein the input/output device comprises a relay contact.

8. The circuit according to claim 7, wherein the programmable current sink circuit wets the relay contact to perform a diagnostic analysis to detect relay contact status conditions.

9. The circuit according to claim 8, wherein a status of at least one of a wetting voltage and a wetting current is monitored.

10. The circuit according to claim 1, wherein the programmable current sink circuit further comprises:
a metal oxide semiconductor field effect transistor (MOSFET).

11. The circuit according to claim 1, wherein the current sink mode provides a programmable DC current sink for a contact input mode and the band pass filter mode provides a band pass filtered measurement to support highway addressable remote transducer (HART) in a current output mode.

12. The circuit according to claim 11, wherein the programmable current sink comprises a single MOSFET to implement dual functions such that the single MOSFET operates in both dual modes of operation, without requiring the use of additional of multiplexors or switches.

13. The circuit according to claim 1, wherein the DAC is configured to provide a current output and a voltage output.

14. A method of sensing signals comprising:
providing a programmable current sink circuit having a plurality of inputs coupled to sense input signals received from at least one input/output device, wherein the programmable current sink circuit comprises a digital-to-analog converter (DAC);
programming the DAC to set an adjustable magnitude of current sink so that a proper amount of current is jointly sunk from the plurality of inputs to generate a total sink current; and selectively operating in dual modes of operation including a first mode of operating as a current sink mode and a second mode of operating as a band pass filter mode.

15. The method according to claim 14, further comprising controlling the programmable current sink circuit utilizing a voltage output set by the DAC to sense the current being sunk.

16. The method according to claim 14, further comprising receiving the input signals that are redundant signals supplied from a plurality of redundant input circuits, and adjusting the magnitude of the current sink to program the redundant inputs of the plurality of redundant input circuits to share the current.

17. The method according to claim 16, further comprising implementing a redundancy scheme, wherein the redundancy scheme is based on dual modular redundancy or triple module redundancy (TMR).

18. The method according to claim 16, further comprising increasing a current contribution of remaining redundant input circuits to maintain the total sink current when at least one redundant input circuit fails.

19. The method according to claim 14, further comprising providing relay contacts as the input/output device and wetting the relay contacts to perform a diagnostic analysis to detect relay contact status conditions.

20. The method according to claim 14, wherein the programmable current sink circuit further comprises a metal oxide semiconductor field effect transistor (MOSFET).

* * * * *

UNITED STATES PATENT AND TRADEMARK OFFICE
CERTIFICATE OF CORRECTION

PATENT NO. : 10,436,843 B2
APPLICATION NO. : 15/528255
DATED : October 8, 2019
INVENTOR(S) : Alan Carroll Lovell et al.

It is certified that error appears in the above-identified patent and that said Letters Patent is hereby corrected as shown below:

In the Specification

Column 6, Line 2, delete "(Universal 10)." and insert therefor -- (Universal IO). --.

Signed and Sealed this
Fourth Day of July, 2023

Katherine Kelly Vidal
*Director of the United States Patent and Trademark Office*